(12) United States Patent
Iwagami et al.

(10) Patent No.: US 6,541,826 B2
(45) Date of Patent: Apr. 1, 2003

(54) FIELD EFFECT SEMICONDUCTOR DEVICE AND ITS PRODUCTION METHOD

(75) Inventors: Toru Iwagami, Tokyo (JP); Yoshifumi Tomomatsu, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/934,652

(22) Filed: Aug. 23, 2001

(65) Prior Publication Data

US 2002/0113274 A1 Aug. 22, 2002

(30) Foreign Application Priority Data

Feb. 16, 2001  (JP) ........................................ 2001-040389

(51) Int. Cl.[7] .............................................. H01L 29/78
(52) U.S. Cl. ........................ 257/379; 438/200; 438/210
(58) Field of Search .......................... 257/379; 438/200, 438/210

(56) References Cited

U.S. PATENT DOCUMENTS 5,079,608 A  * 1/1992 Wodarczyk et al. ......... 257/355
6,172,383 B1 * 1/2001 Williams ..................... 257/173
6,246,092 B1 * 6/2001 Fujihira et al. .............. 257/341
6,327,126 B1 * 12/2001 Miller et al. .................. 361/56

FOREIGN PATENT DOCUMENTS

| JP | 3-238868 | 10/1991 |
| JP | 4-347927 | 12/1992 |

* cited by examiner

Primary Examiner—Allan R. Wilson
(74) Attorney, Agent, or Firm—Oblon, Spivak, McClelland, Maier & Neustadt, P.C.

(57) ABSTRACT

In a field effect semiconductor device in which switching is performed by a gate voltage inputted from outside via a gate resistance circuit for restricting charging and discharge currents flowing between an insulated gate and an emitter, the improvement comprises: an insulated gate electrode portion which is formed by a gate electrode pad and a gate electrode insulated from the gate electrode pad; the gate resistance circuit being inserted between the gate electrode pad and the gate electrode so as to be formed integrally with the insulated gate electrode portion; and the gate resistance circuit comprising a first gate resistance and a first series circuit connected to the first gate resistance in parallel and including a second gate resistance and a first diode such that an anode of the first diode is connected to the gate electrode.

11 Claims, 15 Drawing Sheets

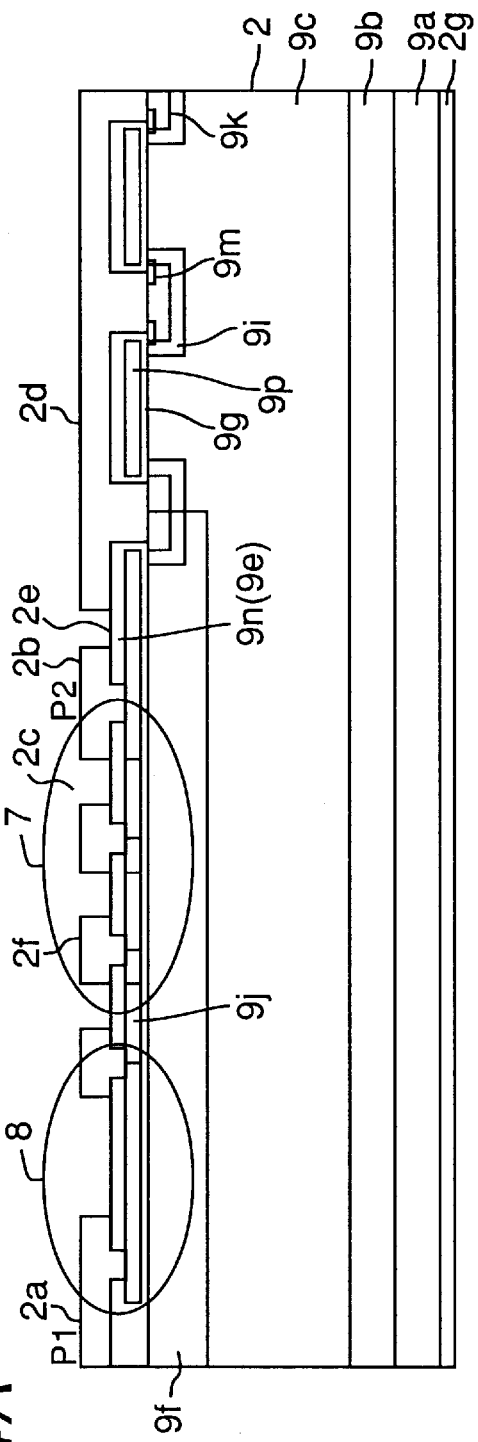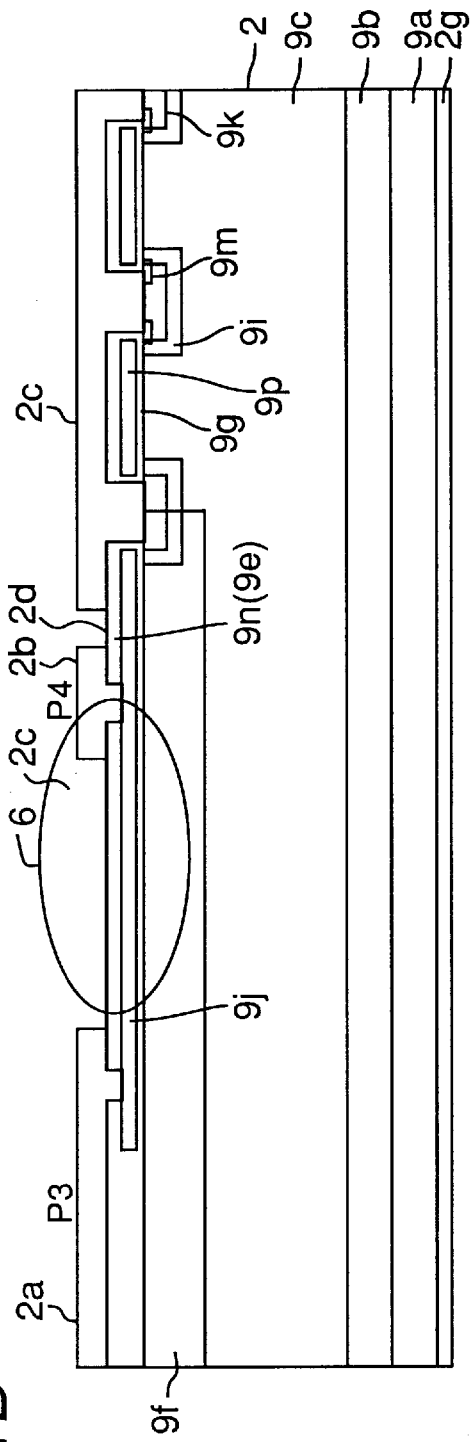
Fig.4A
Fig.4B

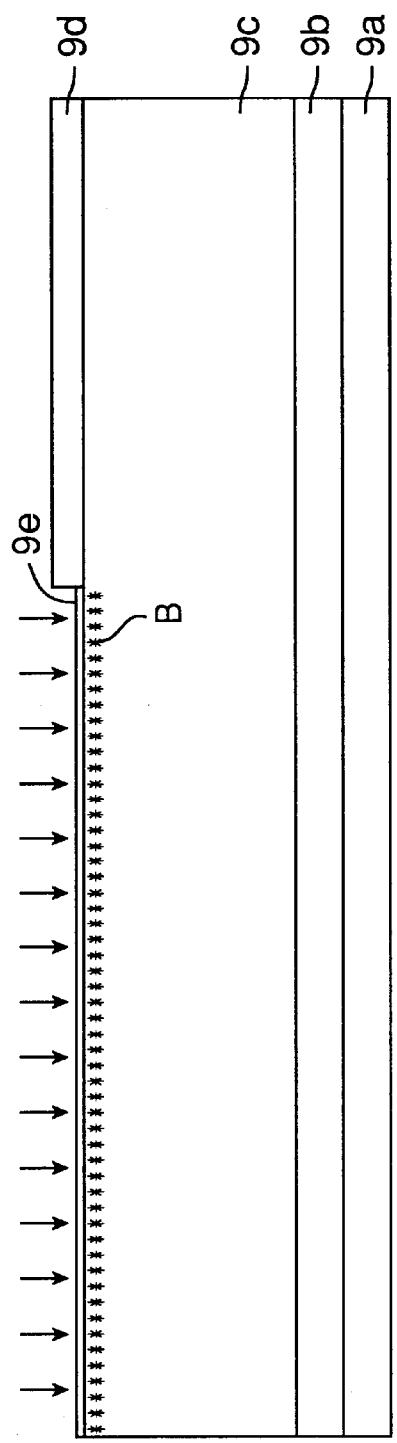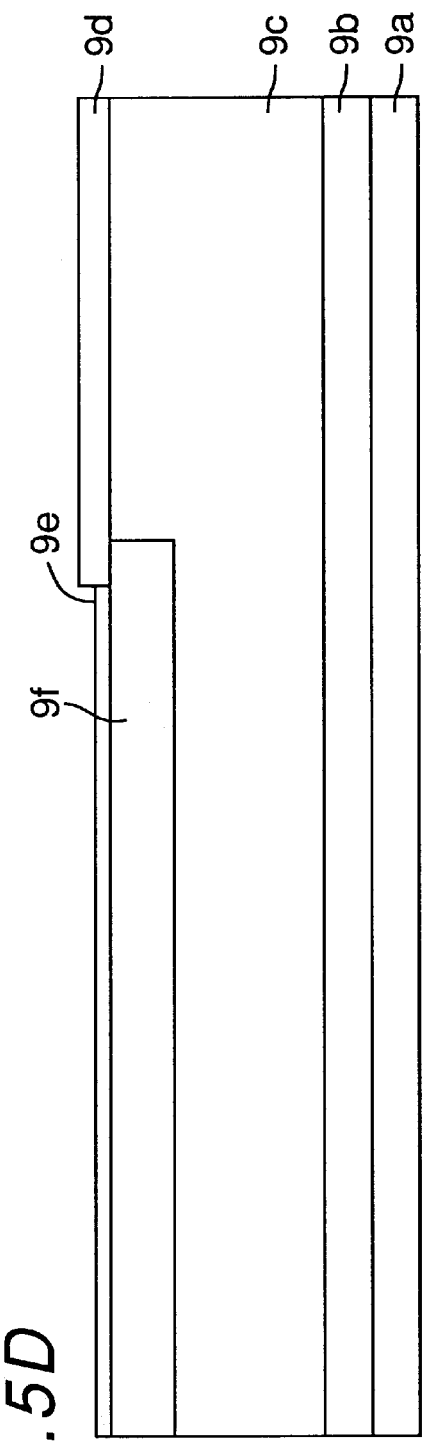

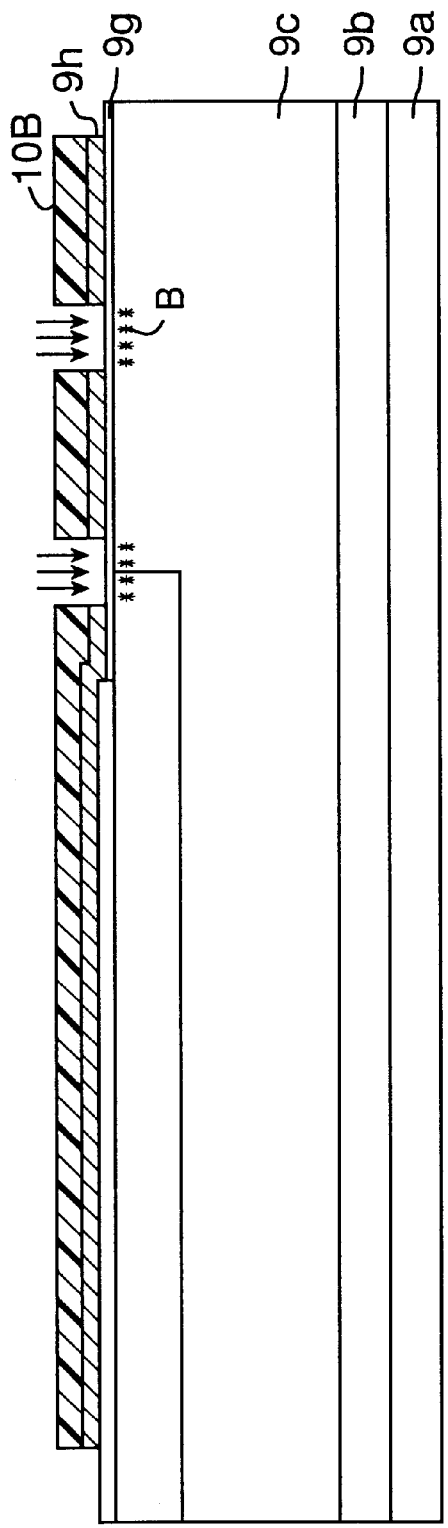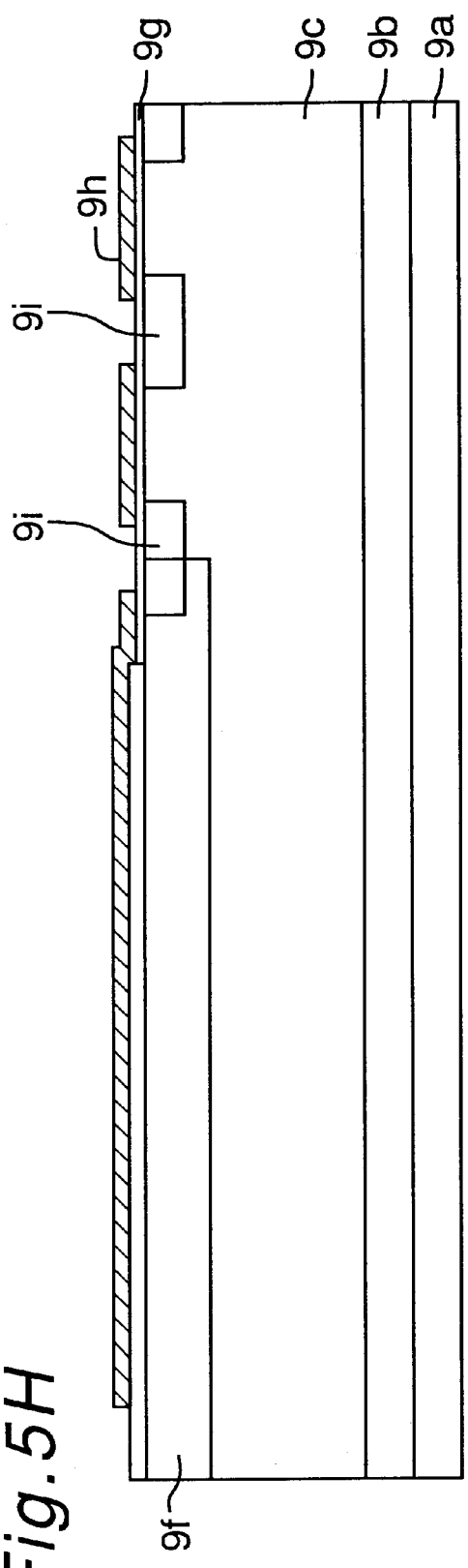

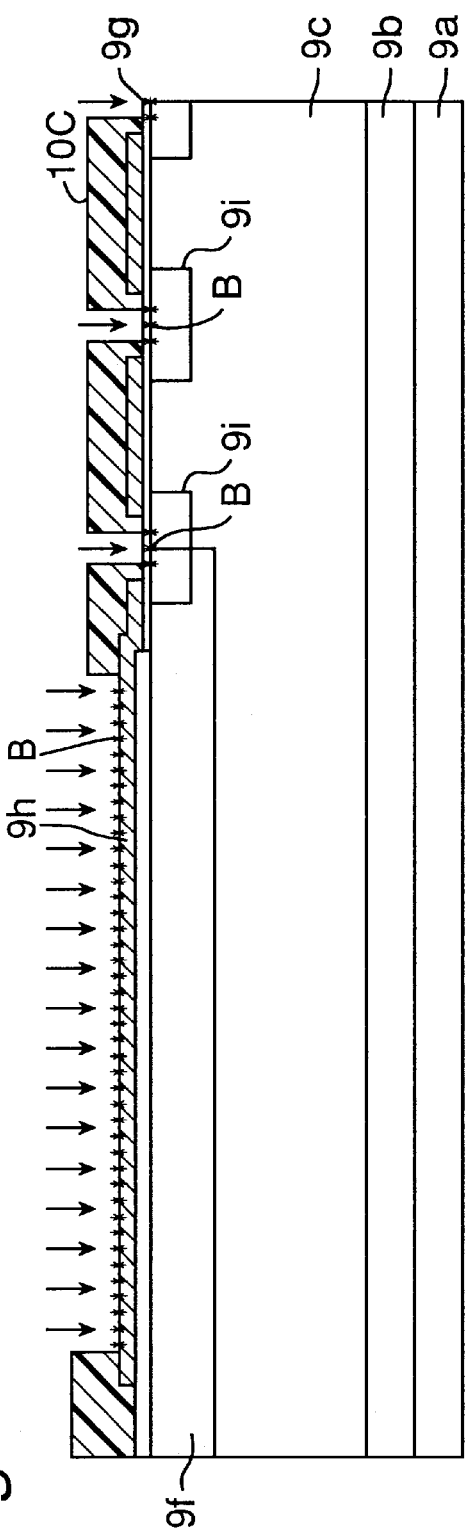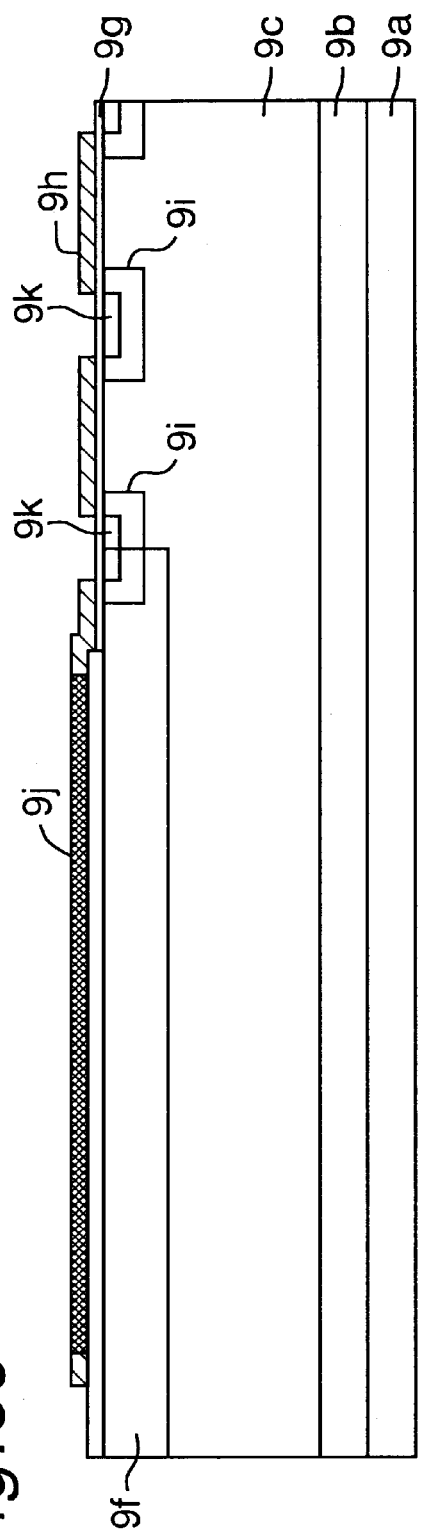

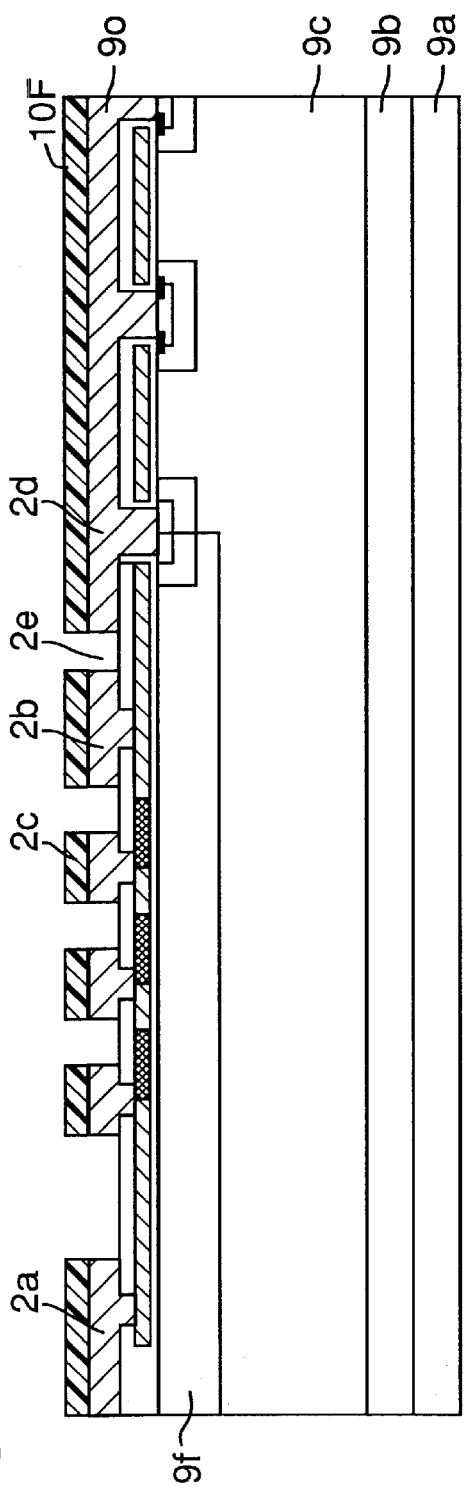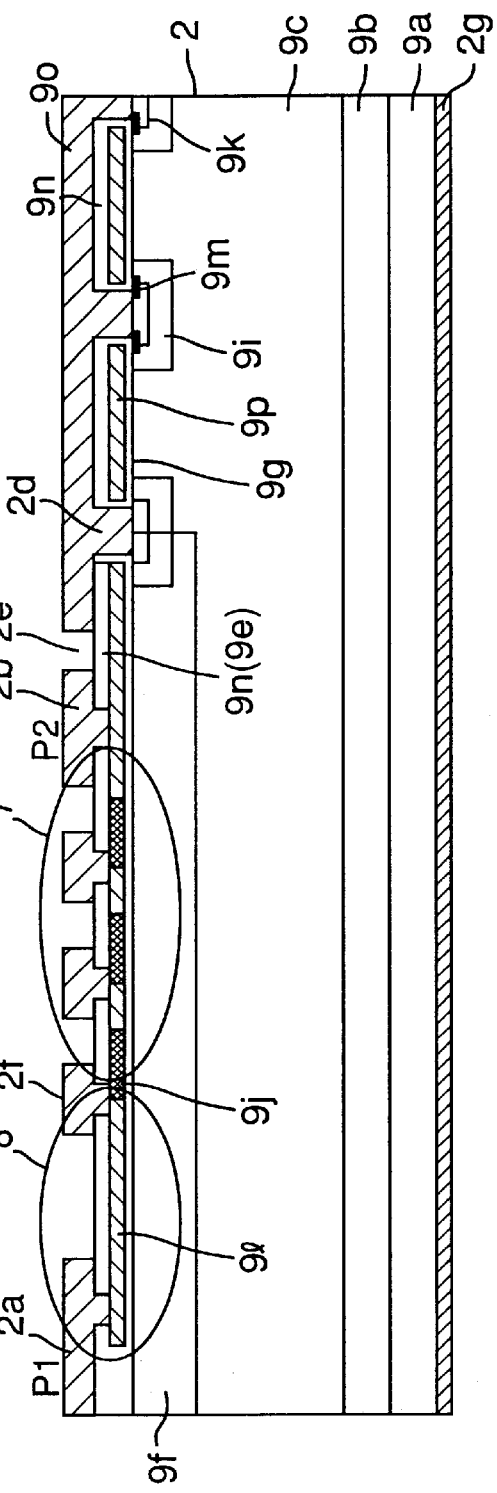

TURN-OFF WAVEFORM OF IGBT (RESISTANCE LOAD)

TURN-OFF WAVEFORM OF IGBT (INDUCTANCE LOAD)

FIELD EFFECT SEMICONDUCTOR DEVICE AND ITS PRODUCTION METHOD

BACKGROUND OF THE INVENTION

1. Field of the Invention

The present invention generally relates to a field effect semiconductor device provided with a gate resistance circuit for restricting gate current of an insulated gate and its production method and more particularly, to the gate resistance circuit and its production method.

2. Description of the Prior Art

For example, a power module into which a main circuit including a field effect semiconductor device such as an insulated-gate bipolar transistor (IGBT) and a control circuit including a control IC for controlling operation of the main circuit are incorporated is applied to an inverter for controlling a motor, etc. Hereinafter, two conventional power modules each including an IGBT are described with reference to FIGS. 7 to 9. In the conventional power module of FIG. 7, a main circuit pattern (not shown) and a control circuit pattern (not shown) are formed on one principal face of an insulated substrate 1. An IGBT 2 acting as a field effect semiconductor device is provided on the main circuit pattern and has a capacity Cge (not shown) between an insulated gate G and an emitter E. Meanwhile, a flywheel diode 3 is provided in a direction opposite to that of the IGBT 2 and in parallel with the IGBT 2. Furthermore, a control IC 4 for controlling the IGBT 2 is provided on the control circuit pattern.

Meanwhile, a gate resistance circuit 5 is inserted between an output terminal 4a of the control IC 4 and an insulated gate terminal (gate pad) 2A of the IGBT 2. The gate resistance circuit 5 restricts charging and discharge currents flowing in and from between the insulated gate G and the emitter E of the IGBT 2, respectively, which are produced by turning on and off a control voltage Vd outputted from the output terminal 4a of the control IC 4, respectively. The gate resistance circuit 5 is constituted by a gate resistance 6 and the insulated substrate 1 has a pattern area (not shown) in which the gate resistance circuit 5 is provided.

Meanwhile, a main circuit terminal (not shown) joined to the main circuit pattern, a control circuit terminal (not shown) joined to the control circuit pattern, etc. are provided on the insulated substrate 1. The main circuit terminal and the control circuit terminal are, respectively, connected to the IGBT 2 and the control IC 4 by aluminum wires. Furthermore, a power module casing (not shown) is constituted by a bottom plate formed by a metal base plate (not shown) of aluminum for placing the insulated substrate 1 thereon and an outer frame (not shown) which is bonded to the metal base plate so as to surround the IGBT 2 and the control IC 4.

Then, operation of the IGBT 2 is described. When the control voltage Vd is turned on in a state in which a power source voltage is applied between the emitter E and a collector C of the IGBT 2 via a load (not shown), the control voltage Vd is outputted from the control terminal 4a of the control IC 4 to the insulated gate G of the IGBT 2 through the gate resistance circuit 5, so that electric current $I_G$ for charging between the insulated gate G and the emitter E of the IGBT 2 flows between the insulated gate G and the emitter E by way of the gate resistance 6 and thus, a gate voltage $V_{GE}$ rises gradually. When the gate voltage $V_{GE}$ has exceeded its threshold voltage Vth, a collector-emitter voltage $V_{CE}$ is turned on and thus, emitter current $I_E$ (collector current $I_C$) flows.

As will be seen from FIGS. 8A and 8B showing turn-off waveforms of the IGBT 2 in the case of a resistance load and an inductance load, respectively, when the control voltage Vd is turned off, electric charge stored between the insulated gate G and the emitter E is discharged by way of the gate resistance 6 and thus, the gate voltage $V_{GE}$ drops gradually. When the gate voltage $V_{GE}$ has reached the threshold voltage Vth or less, the collector-emitter voltage $V_{CE}$ is turned off and thus, the emitter current $I_E$ is interrupted.

Meanwhile, rise and fall rates of the gate voltage $V_{GE}$ of the IGBT 2 upon turning on and off of the control voltage Vd, i.e., values of (dv/dt) are determined by a resistance value of the gate resistance 6 forming the gate resistance circuit 5. When the value of (dv/dt) is large upon turning on of the control voltage Vd, change rate (di/dt) of the emitter current $I_E$ increases necessarily and thus, noises offer a problem. However, even if the value of (dv/dt) is slightly large upon turning off of the control voltage Vd, noises seldom pose a problem. Therefore, in order to restrain, as a countermeasure against the noises, the value of (dv/dt) upon turning on of the control voltage Vd, the resistance value of the gate resistance 6 is set at a comparatively large value.

On the other hand, if the resistance value of the gate resistance 6 is set at the comparatively large value, it takes a long time to charge and discharge between the insulated gate G and the emitter E and thus, turn-off time becomes long. Namely, a time period during which the large emitter current $I_E$ flows while a potential difference between the collector C and the emitter E is large becomes long. As is apparent from comparison between FIG. 8A showing the turn-off waveform of the IGBT 2 in the case of the resistance load and FIG. 8B showing the turn-off waveform of the IGBT 2 in the case of the inductance load, thermal loss increases especially in the case of the inductance load of FIG. 8B, thereby resulting in a risk of thermal breakdown of the IGBT 2.

Therefore, in order to reduce thermal loss of the IGBT 2, it is desirable that, at the time of turning on of the control voltage Vd, the change rate (di/dt) of the emitter current $I_E$ is reduced by restraining the value of (dv/dt) and, at the time of turning off of the control voltage Vd, electric charge stored between the insulated gate G and the emitter E is rapidly discharged such that the emitter current $I_E$ is interrupted in a short time period. To this end, a power module shown in FIG. 9 is known in which in the gate resistance circuit 5, a Zener diode 7 is inserted in parallel with the gate resistance 6 having a large resistance value such that an anode A of the Zener diode 7 is directed towards the insulated gate terminal 2A.

In the known power module shown in FIG. 9, charging between the insulated gate G and the emitter E upon turning on of the control voltage Vd is performed by the gate resistance 6 having the large resistance value and thus, the value of (dv/dt) can be restrained low. On the other hand, upon turning off of the control voltage Vd, electric charge stored between the insulated gate G and the emitter E is rapidly discharged via the Zener diode 7 and thus, the emitter current $I_E$ can be interrupted in a short time period. However, although influence exerted by the value of (dv/dt) at the time of turning off of the control voltage Vd is slight in comparison with that at the time of turning on of the control voltage Vd, noises caused by the large value of (dv/dt) become nonnegligible if discharging is performed excessively rapidly.

In the conventional power module of FIG. 7, the control voltage Vd is outputted from the control IC 4 to the insulated gate terminal 2A by way of the gate resistance 6 and charging and discharging between the insulated gate G and the emitter E are performed through the gate resistance 6. Hence, if the resistance value of the gate resistance 6 is set at the comparatively large value so as to limit charging current between the insulated gate G and the emitter E to a proper value such that generation of high surge voltage due to the large change rate (di/dt) of the emitter current $I_E$ is restricted, a comparatively long period is required at the time of turning off of the control voltage Vd for discharging electric current stored between the insulated gate G and the emitter E, so that it takes a long time to interrupt the emitter current $I_E$ and thus, great thermal loss is incurred disadvantageously.

In order to eliminate the above disadvantage of the conventional power module of FIG. 7, the Zener diode 7 is inserted in parallel with the gate resistance 6 in the known power module of FIG. 9 such that electric charge stored between the insulated gate G and the emitter E is rapidly discharged via the Zener diode 7 upon turning off the control voltage Vd. However, at this time, such problems arise that high surge voltage due to the high change rate (di/dt) of the emitter current $I_E$ is generated, etc.

Meanwhile, since the gate resistance circuit 5 (FIG. 7) formed by the gate resistance 6 or the gate resistance circuit (FIG. 9) formed by the gate resistance 6 and the Zener diode 7 connected to the gate resistance 6 in parallel is provided on the insulated substrate 1 together with the IGBT 2, the flywheel diode 3 and the control IC 4 so as to occupy a wiring area of the insulated substrate 1, size of the insulated substrate 1 becomes large, so that such drawbacks are incurred that production cost of the power module rises and inductance of the circuit patterns increases.

SUMMARY OF THE INVENTION

Accordingly, an essential object of the present invention is to provide, with a view to eliminating the above mentioned drawbacks of prior art field effect semiconductor devices, a field effect semiconductor device in which production of high surge voltage at the time of its turning on is restricted and load loss is small at the time of its turning off.

Another important object of the present invention is to provide a field effect semiconductor device in which by eliminating the need for space used exclusively for providing a gate resistance on an insulated substrate, the insulated substrate is made compact such that inductance of circuit patterns of the insulated substrate is reduced.

In order to accomplish these objects of the present invention, the improvement comprises in a field effect semiconductor device in which switching is performed by a gate voltage inputted from outside via a gate resistance circuit for restricting charging and discharge currents flowing between an insulated gate and an emitter: an insulated gate electrode portion which is formed by a gate electrode pad and a gate electrode insulated from the gate electrode pad; the gate resistance circuit being inserted between the gate electrode pad and the gate electrode so as to be formed integrally with the insulated gate electrode portion; and the gate resistance circuit comprising a first gate resistance and a first series circuit connected to the first gate resistance in parallel and including a second gate resistance and a first diode such that an anode of the first diode is connected to the gate electrode.

BRIEF DESCRIPTION OF THE DRAWINGS

These objects and features of the present invention will become apparent from the following description taken in conjunction with the preferred embodiment thereof with reference to the accompanying drawings in which:

FIGS. 4A and 4B are sectional view taken along the lines IVA—IVA and IVB—IVB in FIG. 3, respectively;

Before the description of the present invention proceeds, it is to be noted that like parts are designated by like reference numerals throughout several views of the accompanying drawings.

DETAILED DESCRIPTION OF THE INVENTION

Figure 1:
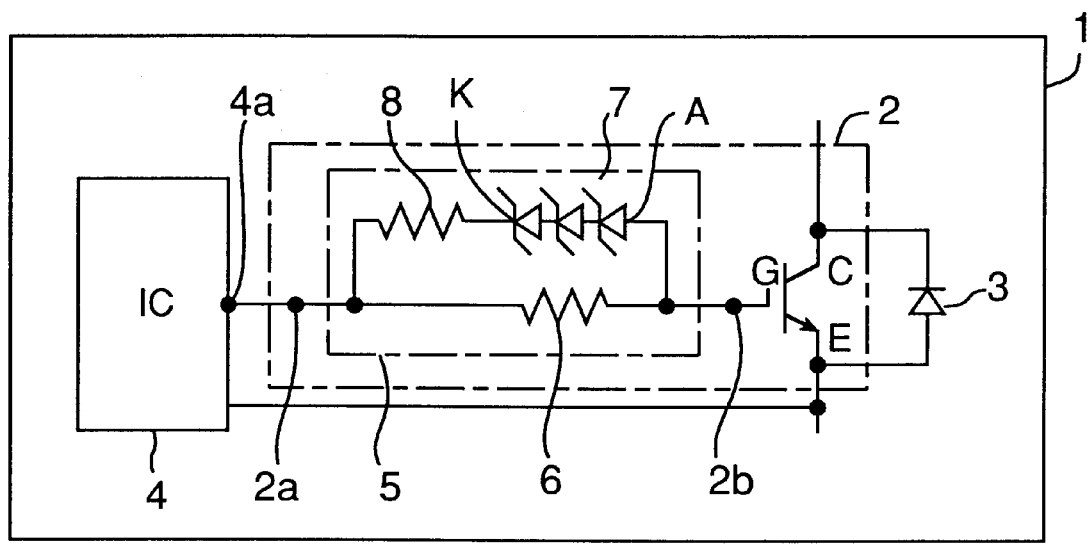
FIG. 1 is a circuit diagram of a power module employing a field effect semiconductor device (IGBT) according to a first embodiment of the present invention.

Hereinafter, embodiments of the present invention are described with reference to the drawings. In the drawings, parts designated by the same reference numerals as those of prior art in FIGS. 7 to 9 corresponds to those of prior art.
(First embodiment)

A power semiconductor device according to a first embodiment of the present invention is described with reference to FIG. 1 to FIGS. 5A to 5P. FIG. 1 shows a power module employing an insulated-gate bipolar transistor (IGBT) 2 acting as a field effect semiconductor device according to the first embodiment of the present invention. In the power module of FIG. 1, a main circuit pattern (not shown) and a control circuit pattern (not shown) are formed on one principal face of an insulated substrate 1. The IGBT 2 is provided on the main circuit pattern and has a capacity Cge (not shown) between an insulated gate G and an emitter E. Meanwhile, a flywheel diode 3 is provided in a direction opposite to that of the IGBT 2 and in parallel with the IGBT 2. Furthermore, a control IC 4 for controlling the IGBT 2 is provided on the control circuit pattern. Meanwhile, in the IGBT 2, a gate resistance circuit 5 is inserted between a gate electrode pad 2a and a gate electrode 2b insulated from the gate electrode pad 2a. The gate resistance circuit 5 restricts charging and discharge currents flowing in and from between the insulated gate G and the emitter E of the IGBT 2, respectively, which are produced by turning on and off a control voltage Vd outputted from an output terminal 4a of the control IC 4, respectively. The gate resistance circuit 5 is constituted by a first gate resistance 6 and a series circuit connected to the first gate resistance 6 in parallel and including a Zener diode 7 and a second gate resistance 8. An anode A and a cathode K of the Zener diode 7 are, respectively, connected to the gate electrode 2b and the second electrode 8.

Meanwhile, a main circuit terminal (not shown) joined to the main circuit pattern, a control circuit terminal (not shown) joined to the control circuit pattern, etc. are provided on the insulated substrate 1. The main circuit terminal and the control circuit terminal are, respectively, connected to the IGBT 2 and the control IC 4 by aluminum wires. Furthermore, a power module casing (not shown) is constituted by a bottom plate formed by a metal base plate (not shown) of aluminum for placing the insulated substrate 1 thereon and an outer frame (not shown) which is bonded to the metal base plate so as to surround the IGBT 2 and the control IC 4.

Then, operation of the IGBT 2 is described with reference to FIG. 2. When the control voltage Vd (on-state voltage) outputted from the output terminal 4a of the control IC 4 is applied to the gate electrode pad 2a of the IGBT 2 in a state in which a power source voltage is applied between the emitter E and a collector C of the IGBT 2 through a load (not shown), the charging current charges between the insulated gate G and the emitter E via the first gate resistance 6 of the gate resistance circuit 5 inserted between the gate electrode pad 2a and the gate electrode 2b and the gate electrode 2b. Namely, even if the control voltage Vd is applied to the gate electrode pad 2a, energization of the second gate resistance 8 is prevented by the Zener diode 7 and thus, the charging current flowing in between the insulated gate G and the emitter E is restricted by the first gate resistance 6. Thus, a gate voltage $V_{GE}$ of the IGBT 2 gradually rises at a predetermined rate (dv/dt). When the gate voltage $V_{GE}$ has exceeded its threshold voltage Vth, a collector-emitter voltage $V_{CE}$ is turned on and emitter current $I_E$ (collector current $I_C$) flows.

On the other hand, when the control voltage Vd is turned off, electric charge stored between the insulated gate G and the emitter E is discharged by way of the first gate resistance 6 and the series circuit including the Zener diode 7 and the second gate resistance 8 and thus, the gate voltage $V_{GE}$ drops gradually. When the gate voltage $V_{GE}$ has reached the threshold voltage Vth or less, the collector-emitter voltage $V_{CE}$ is turned off and thus, the emitter current $I_E$ is interrupted.

Namely, rise and fall rates of the gate voltage $V_{GE}$ upon turning on and off of the control voltage Vd are, respectively, determined by a resistance value of the first gate resistance 6 and a combined resistance of the first and second gate resistances 6 and 8 connected to each other in parallel. Therefore, if resistance values of the first and second gate resistances 6 and 8 are set at proper values, the rise rate (dv/dt) of the gate voltage $V_{GE}$ upon turning on of the control voltage Vd is restricted, so that change rate (di/dt) of the emitter current $I_E$ can be lessened and thus, generation of noises due to increase of the change rate (di/dt) of the emitter current $I_E$ can be prevented. On the other hand, at the time of turning off of the emitter current $I_E$, if electric charge stored between the insulated gate G and the emitter E is discharged rapidly by properly raising the fall rate (dv/dt) of the gate voltage $V_{GE}$, the emitter current $I_E$ is interrupted rapidly, so that thermal loss of the IGBT 2 is reduced and thus, thermal breakdown of the IGBT 2 is prevented.

Meanwhile, at the time of turning off of the control voltage Vd, if the gate voltage $V_{GE}$ is lowered to not more than a forward voltage VF obtained at the time of start of energization of the Zener diode 7, the discharge current flows through only the first gate resistance 6 without flowing through the second gate resistance 8 and the value of (dv/dt) is opposite in polarity to but identical in magnitude with that obtained at the time of turning on of the control voltage Vd.

Figure 2:
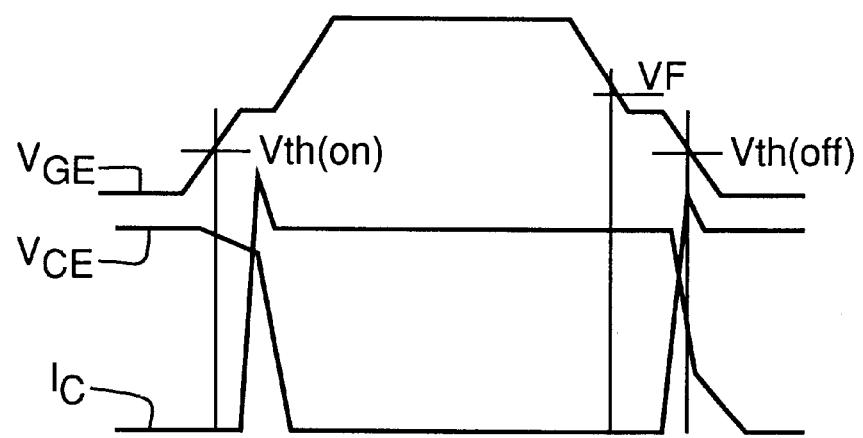
FIG. 2 is a time chart explanatory of operation of the field effect semiconductor device (IGBT) of FIG. 1.

Thus, if the forward voltage VF of the Zener diode 7 is set to be not less than the threshold voltage Vth of the gate voltage $V_{GE}$ as shown in FIG. 2, the gate voltage $V_{GE}$ is lowered rapidly in a first half stage of discharge and is lowered slowly in a last half stage of discharge, so that not only thermal loss of the IGBT 2 is lessened but production of noises can be restrained.

In order to set the forward voltage VF of the Zener diode 7 to be not less than the threshold voltage Vth of the gate voltage $V_{GE}$, the Zener diode 7 is formed by a plurality of, for example, three Zener diode elements connected to each other in series as shown in FIG. 1 but may be alternatively formed by a single Zener diode element having a required area.

Figure 3:
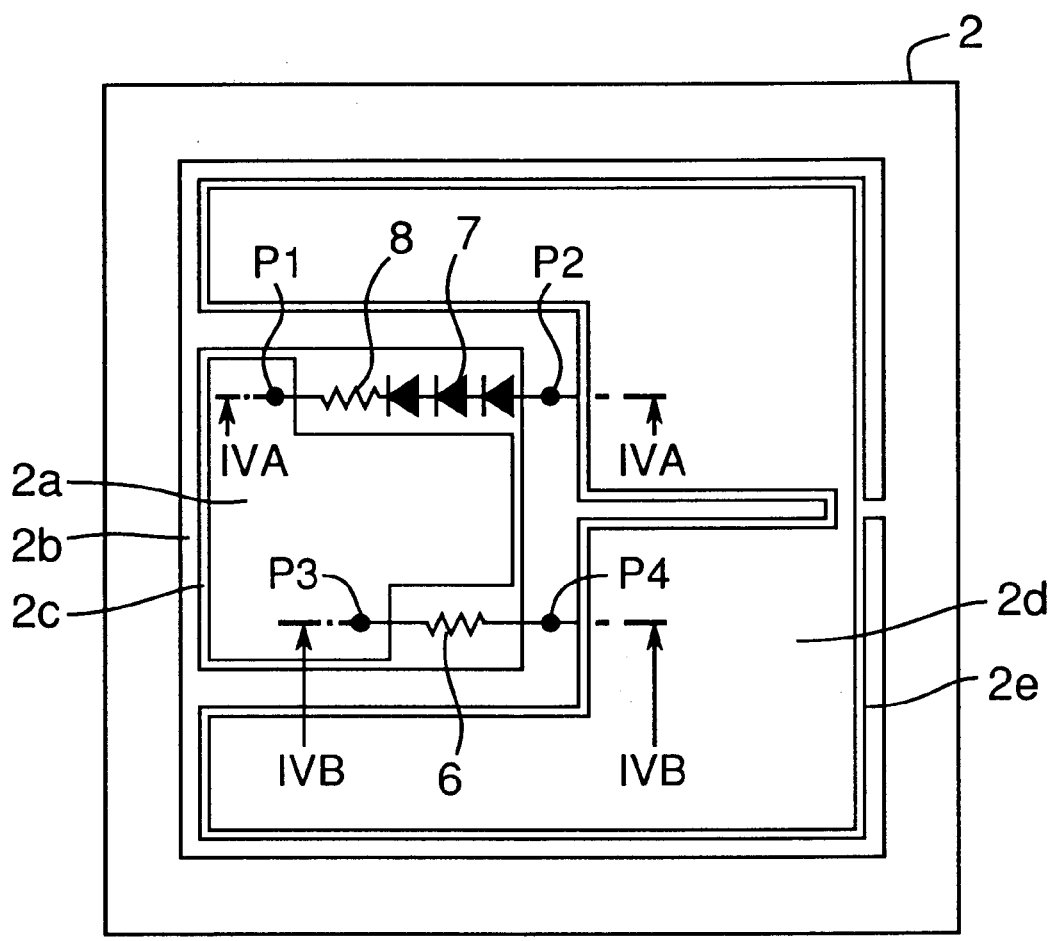
FIG. 3 is a top plan view showing a configuration of the field effect semiconductor device of FIG. 1.

Then, a structure of the IGBT 2 is described with reference to FIGS. 3 and 4. FIG. 3 is a top plan view of the IGBT 2, while FIGS. 4A and 4B are sectional views taken along the lines IVA—IVA and IVB—IVB in FIG. 3, respectively. In FIGS. 3 and 4, the gate electrode 2b is formed so as to surround the gate electrode pad 2a through an insulation groove 2c, while an emitter electrode 2d is divided into halves by the gate electrode 2b and is surrounded by the gate electrode 2b via an insulation groove 2e. Meanwhile, the first gate resistance 6 and the series circuit including the Zener diode 7 and the second gate resistance 8, which form the gate resistance circuit 5, are inserted in parallel between the gate electrode pad 2a and the gate electrode 2b and are formed integrally with an insulated gate electrode portion constituted by the gate electrode pad 2a and the gate electrode 2b.

Figure 5A:
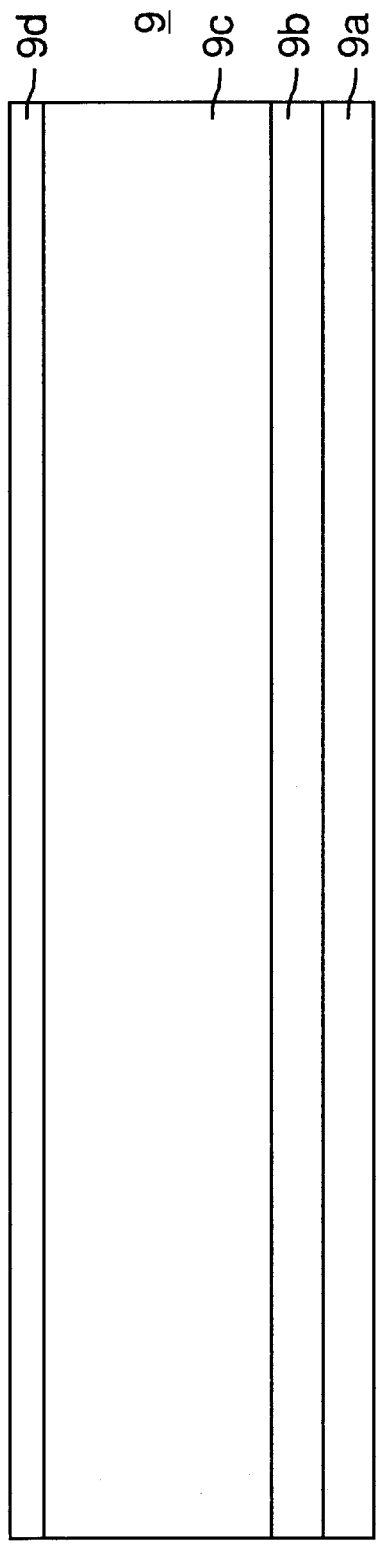
FIGS. 5A to 5P are schematic sectional views explanatory of first to sixteenth steps of a production process of the field effect semiconductor device of FIG. 3, respectively.
Figure 5B:
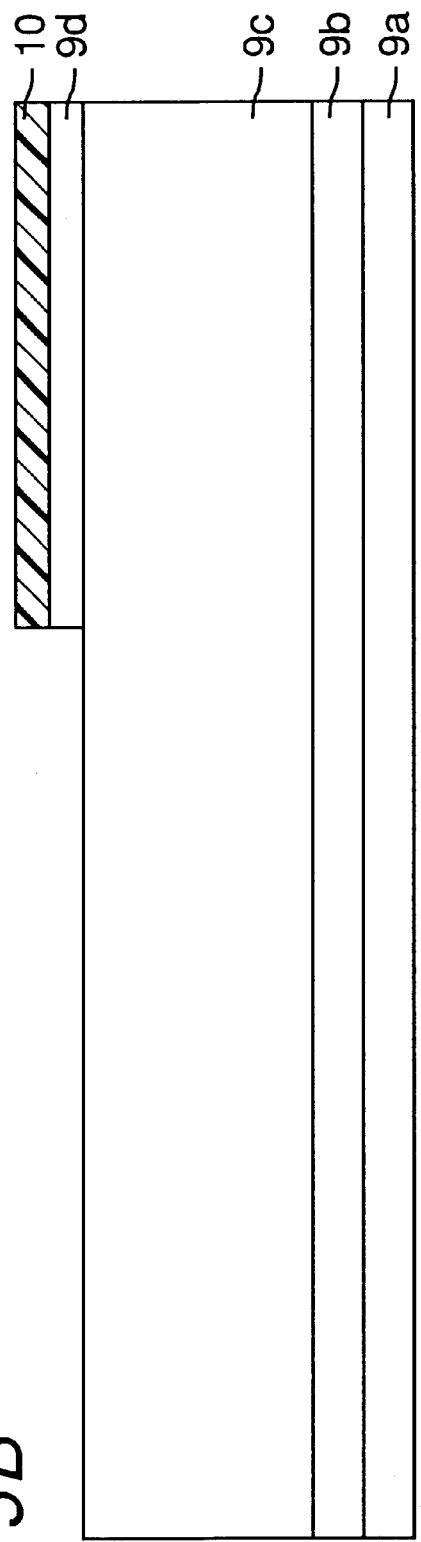

Hereinafter, first to sixteenth steps of a production process of the IGBT 2 formed integrally with the gate resistance circuit 5 are described with reference to FIGS. 5A to 5P, respectively. Initially, as shown in FIG. 5A, a silicon wafer 9 in which a P+ collector layer 9a, an N+ buffer layer 9b and an N− layer 9c are preliminarily formed is prepared and a first oxide film 9d is formed on the N− layer 9c of the silicon wafer 9 (first step). Then, as shown in FIG. 5B, a resist layer 10 is provided on a portion of the oxide film 9d by photolithography and the remaining portion of the oxide film 9d is removed by etching (second step).

Subsequently, as shown in FIG. 5C, a second oxide film 9e is formed on a portion of the N− layer 9c exposed by removing the first oxide film 9d therefrom and boron (B) is introduced into the N− layer 9c through the second oxide film 9e by ion implantation (third step). Thereafter, as shown in FIG. 5D, the boron introduced into the N− layer 9c is diffused by thermal diffusion so as to be formed into a P type diffused layer 9f (fourth step).

Figure 5E:
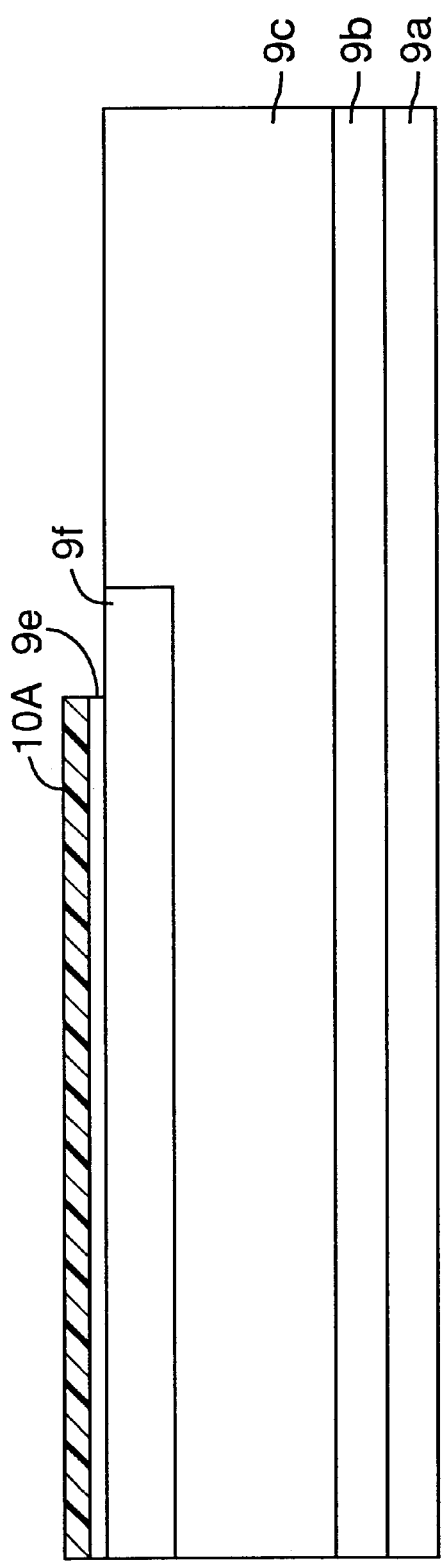
Figure 5F:
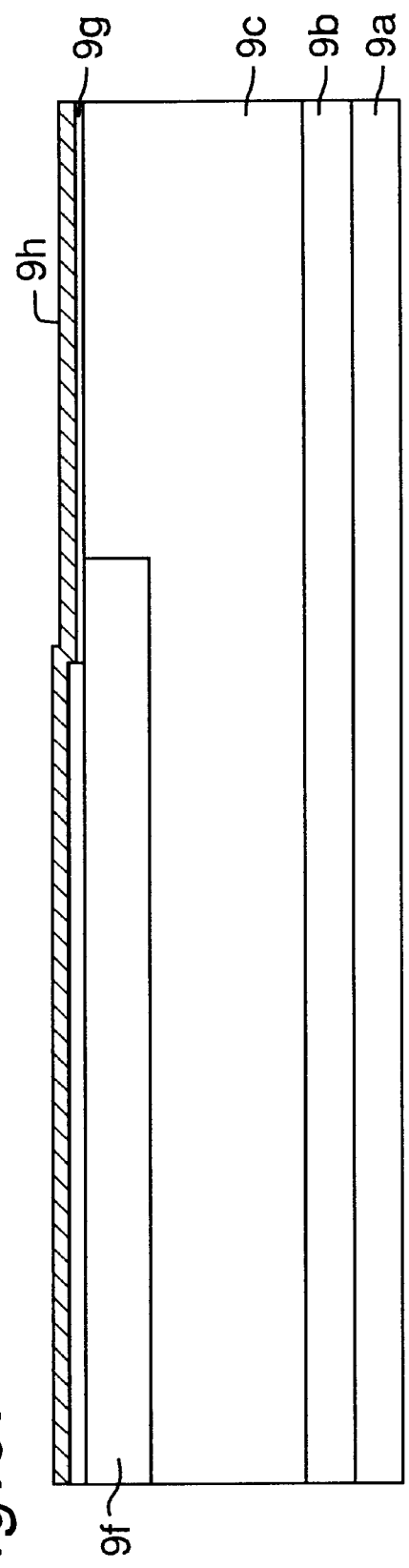

Then, as shown in FIG. 5E, a resist layer 10A is provided by photolithography in an area other than a portion for forming a cell and the first oxide film 9d in the portion for forming the cell is removed by etching (fifth step). Subsequently, as shown in FIG. 5F, a gate oxide film 9g is formed on a portion of the N− layer 9c exposed by removing the first oxide film 9d therefrom and a polysilicon layer 9h is formed on the gate oxide film 9g (sixth step).

Thereafter, as shown in FIG. 5G, a resist layer 10B is provided on the polysilicon layer 9h by photolithography and boron (B) is introduced by ion implantation into the N− layer 9c via the gate oxide film 9g exposed by removing a predetermined area of the polysilicon layer 9h by etching (seventh step). Then, as shown in FIG. 5H, the boron introduced into the N− layer 9c is diffused by thermal diffusion so as to be formed into a P base layer 9j (eighth step).

Subsequently, as shown in FIG. 5I, a resist layer 10C is provided on an other portion than a portion of the polysilicon layer 9h and an other portion than a portion of the gate oxide film 9g by photolithography and boron (B) is introduced into the exposed portion of the polysilicon layer 9h and, through the exposed portion of the gate oxide film 9g, into the P base layer 9i by ion implantation (ninth step). Thereafter, as shown in FIG. 5J, the boron introduced into the portion of the polysilicon layer 9h and the P base layer 9i is diffused by thermal diffusion so as to be formed into a P type polysilicon layer 9j in the portion of the polysilicon layer 9h and a P+ layer 9k in the P base layer 9i (tenth step).

Figure 5K:
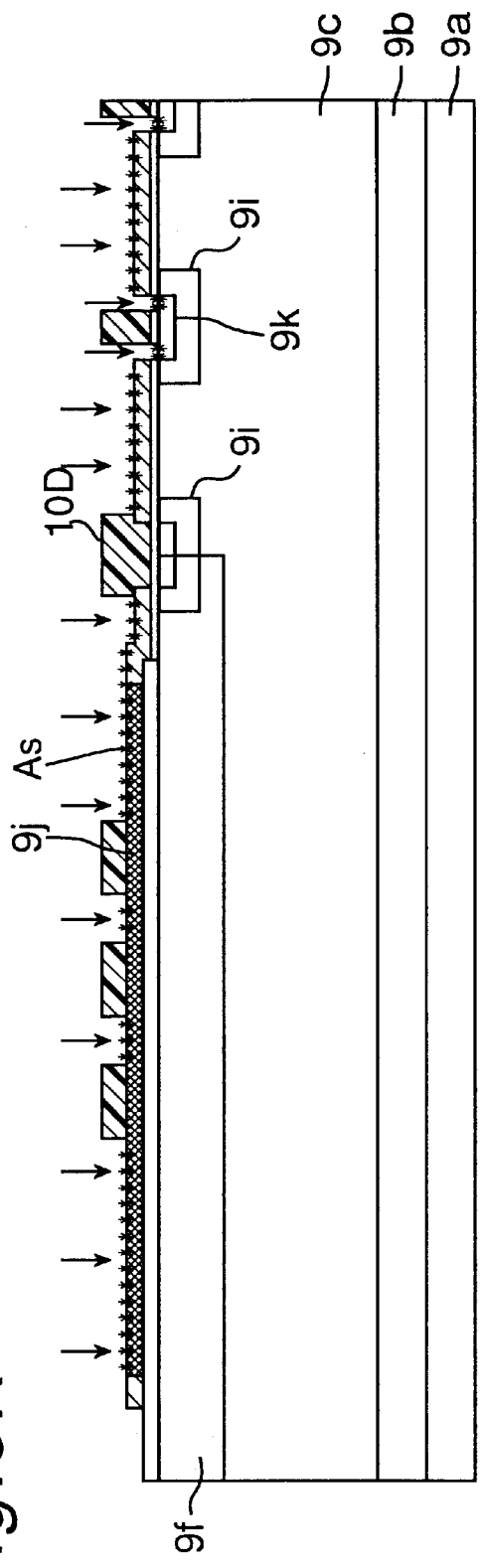
Figure 5L:
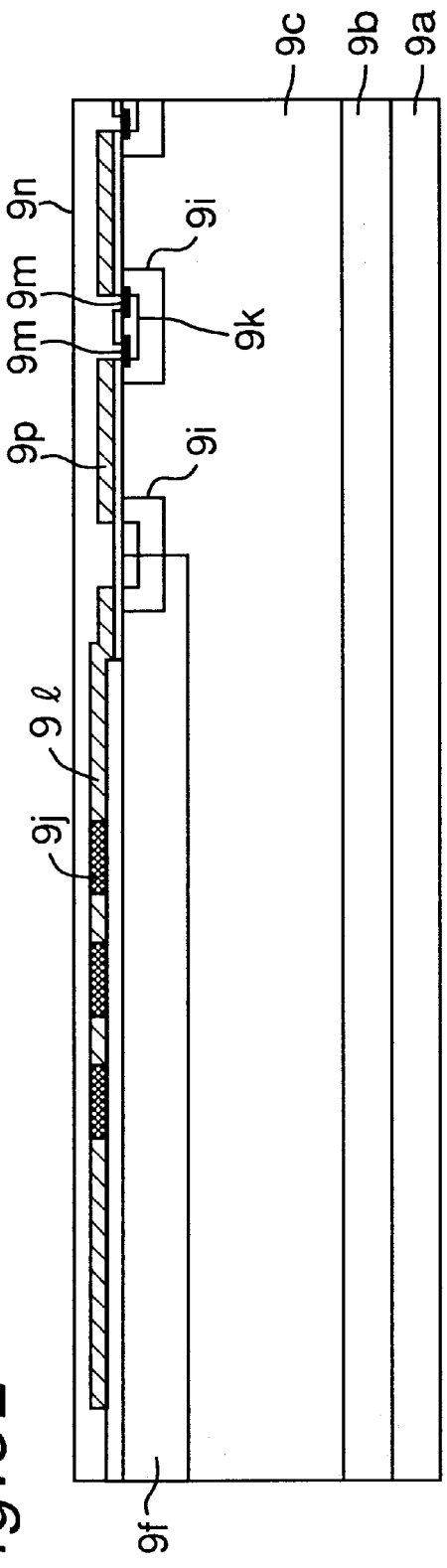

Then, as shown in FIG. 5K, a resist layer 10D is formed on an other portion than a portion of the polysilicon layer 9h, an other portion than a portion of the P type polysilicon layer 9j and an other portion than a portion of the P+ layer 9k by photolithography and arsenic (As) is introduced, after removal of the gate oxide film 9g on the P+ layer 9k, by ion implantation into areas of the P type polysilicon layer 9j and the P+ layer 9k exposed from the resist layer 10 (eleventh step). Subsequently, as shown in FIG. 5L, the arsenic introduced into the P type polysilicon layer 9j and the P+ layer 9k is diffused by thermal diffusion so as to be formed into an N type polysilicon layer 9l and an N type polysilicon gate 9p in the portion of the P type polysilicon layer 9j and an N emitter layer 9m in the portion of the P+ layer 9k and an interlayer dielectric layer 9n for covering a whole surface is formed (twelfth step).

Figure 5M:
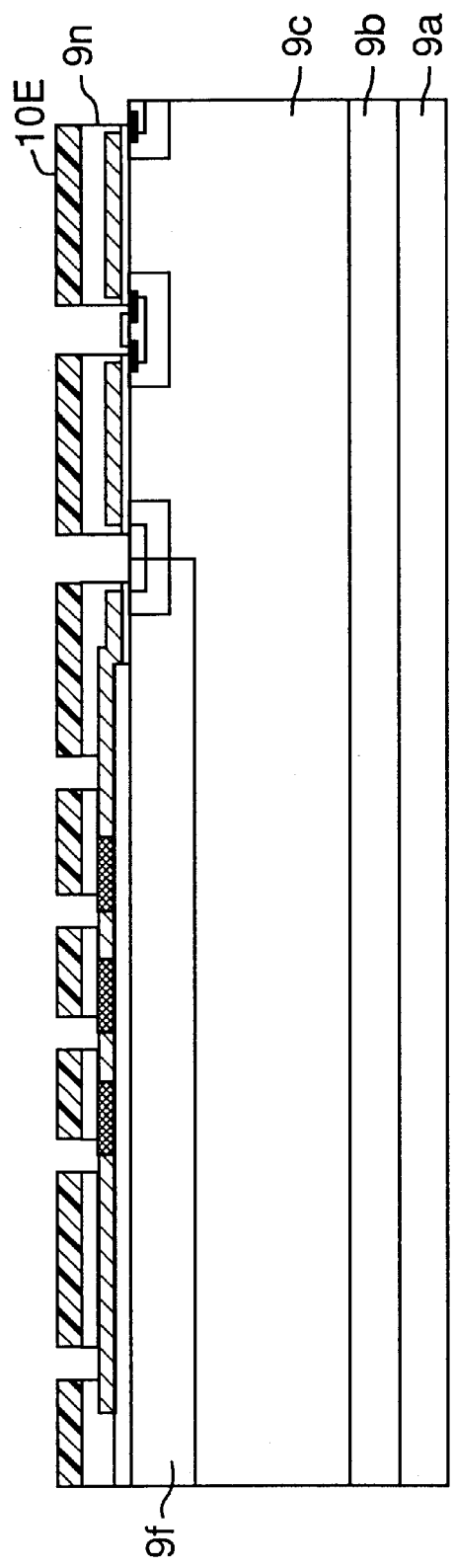
Figure 5N:
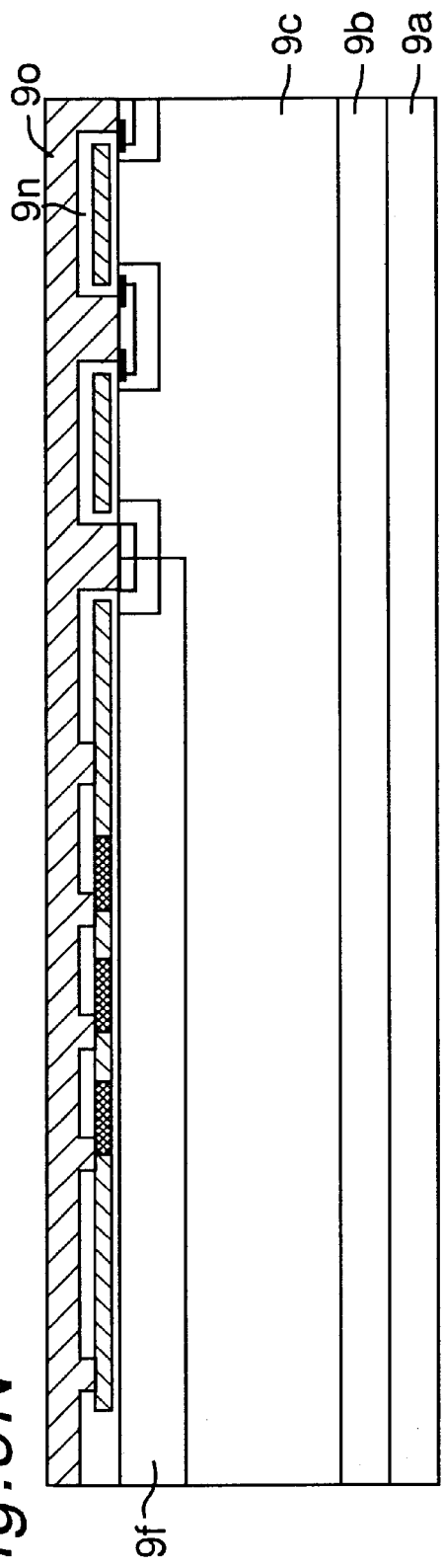

Thereafter, as shown in FIG. 5M, a resist layer 10E is formed on an other portion than a portion of the interlayer dielectric layer 9n by photolithography and the exposed portion of the interlayer dielectric layer 9n is removed by etching (thirteenth step). Then, as shown in FIG. 5N, an aluminum electrode layer 9o is formed on an exposed surface of a structure of FIG. 5M (fourteenth step).

Subsequently, as shown in FIG. 5O, a resist layer 10F is provided on an other portion than a portion of the aluminum electrode layer 9o by photolithography and the exposed portion of the aluminum electrode layer 9o is removed by etching such that not only the gate electrode pad 2a, the gate electrode 2b and the emitter electrode 2d are formed but the second gate resistance (resistance portion) 8 and the Zener diode (diode portion) 7 connected to the second gate resistance 8 in series and including a plurality of, for example, three Zener diode elements are formed between the gate electrode pad 2a and the gate electrode 2b (fifteenth step). Finally, as shown in FIG. 5P, a collector electrode 2g is formed on a rear face of the silicon wafer 9 (sixteenth step). As a result, the IGBT 2 formed integrally with the gate resistance circuit 5 has been finished.

Namely, by the above described steps of the production process as shown in FIGS. 5A to 5P, the IGBT 2 formed integrally with the gate resistance circuit 5 has been finished. Meanwhile, reference numeral 2f in FIG. 5P designates each of lead-out electrodes (terminals) among the Zener diode elements of the Zener diode 7 and between the second gate resistance 8 and the Zener diode elements of the Zener diode 7 but is abbreviated in FIG. 3.

Figure 7:
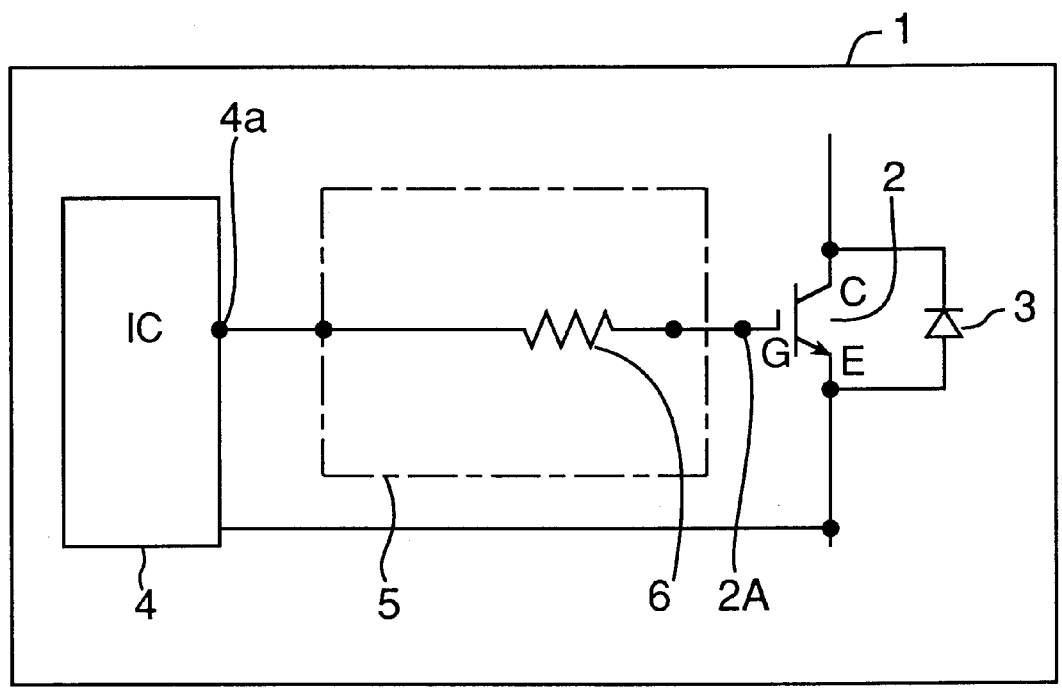
FIG. 7 is a circuit diagram of a power module employing a prior art field effect semiconductor device (IGBT)
Figure 8A:
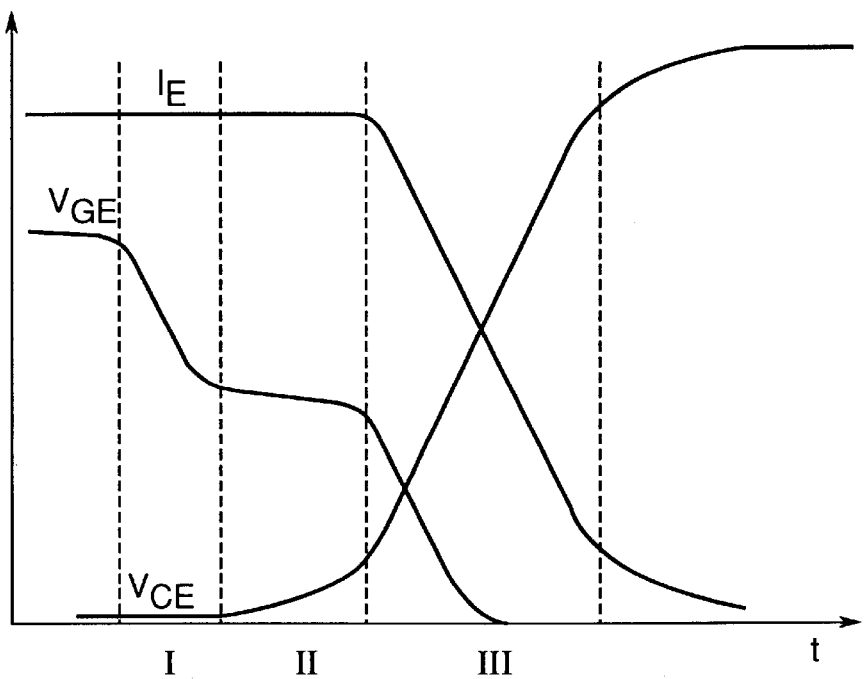
FIGS. 8A and 8B are time charts explanatory of operation of the prior art field effect semiconductor device (IGBT) of FIG. 7 in the case of a resistance load and an inductance load, respectively.
Figure 8B:
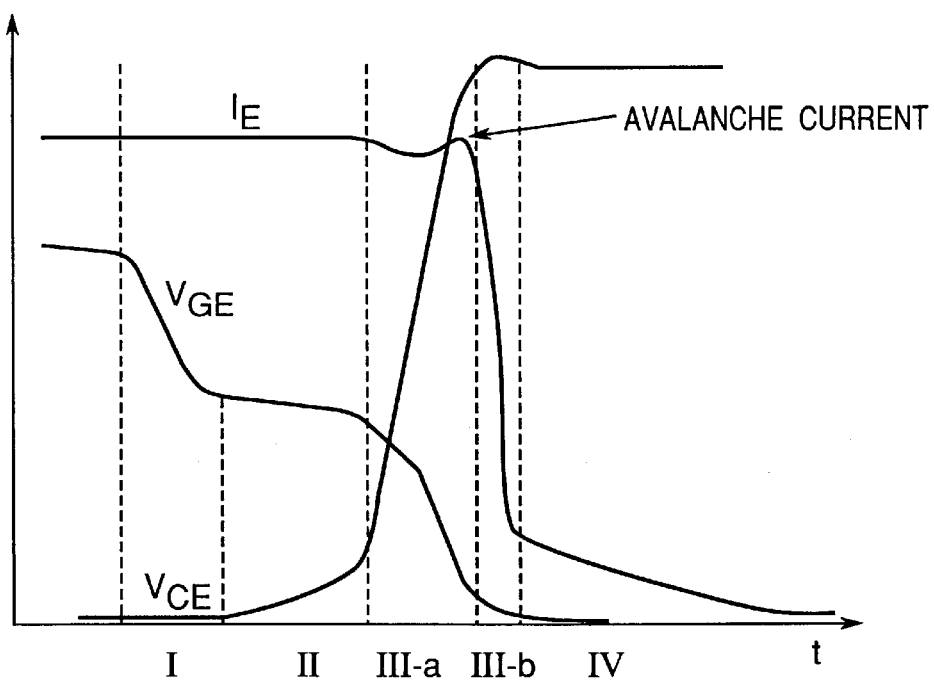
Figure 9:
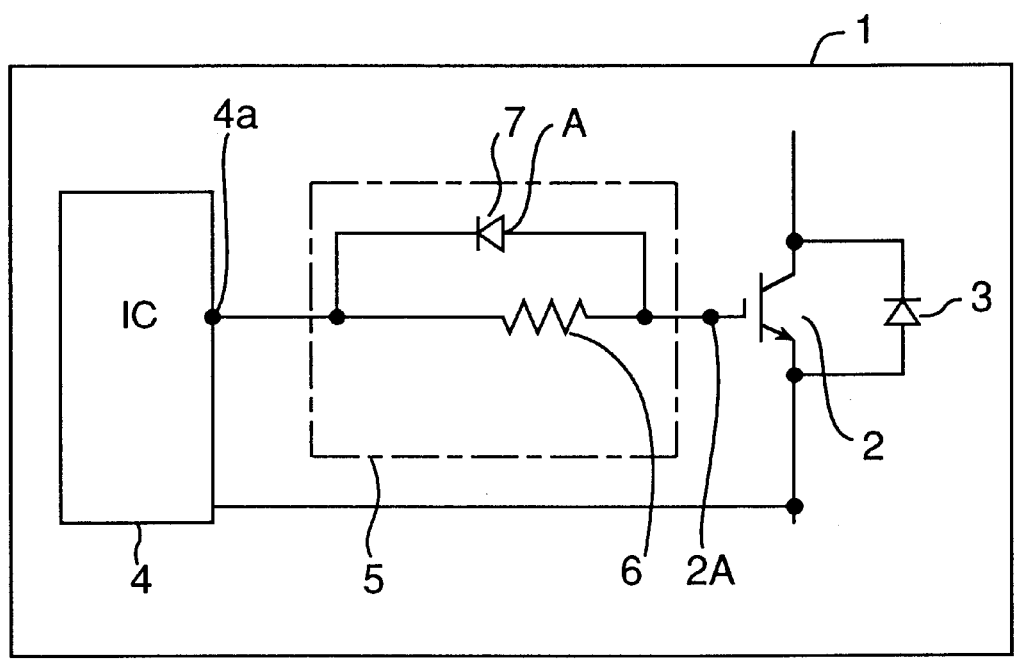
FIG. 9 is a circuit diagram of a power module employing another prior art field effect semiconductor device (IGBT).

Meanwhile, in case the IGBT 2 in which the gate resistance circuit 5 is integrally built in the insulated gate portion as shown in FIG. 3 is mounted on the insulated substrate 1 as shown in FIG. 1, the need for a space of a circuit pattern area for providing the insulated gate resistance 5 is eliminated in contrast with conventional arrangements of FIGS. 7 and 9, so that the insulated substrate 1 is made more compact and wiring is simplified. As a result, the power module having the insulated substrate 1 mounted thereon is made compact. In addition, since the production process of the IGBT 2 is simplified, the highly reliable IGBT 2 can be produced at low cost.

In production of the IGBT 2, the N type polysilicon layer 9l acting as the resistance portion and the P type polysilicon layer 9j and the N type polysilicon layer 9l arranged alternately and acting as the diode portion are formed integrally with the N type polysilicon gate 9p acting as the insulated gate portion, the number of the production steps of the silicon wafer 9 is reduced, so that the highly reliable silicon wafer 9 can be produced at low cost.

(Second Embodiment)

Figure 6:
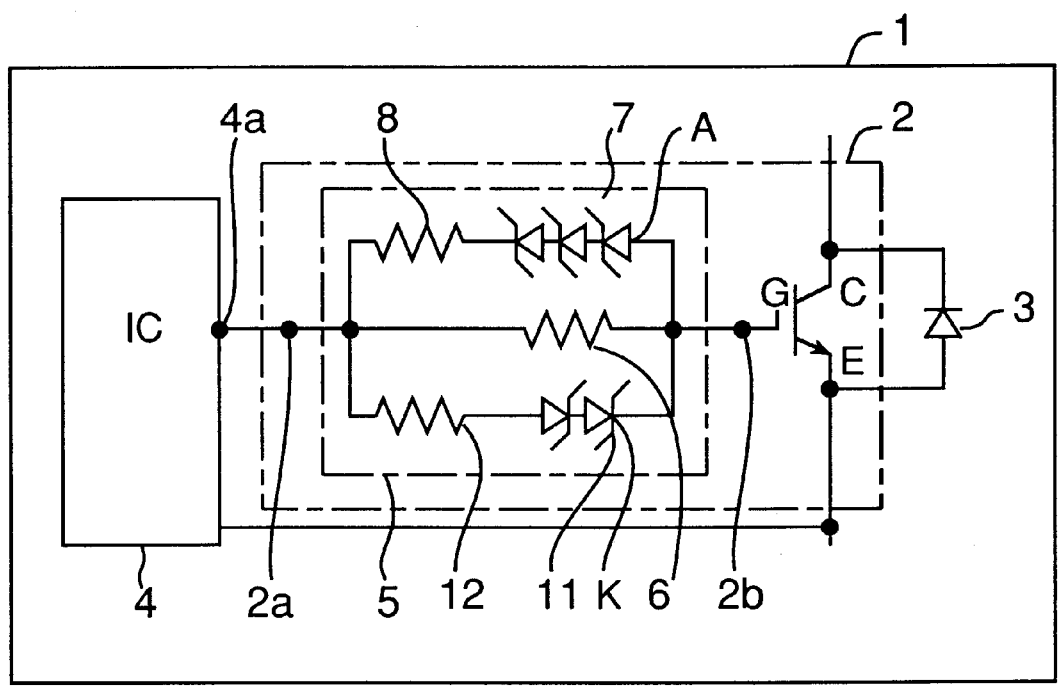
FIG. 6 is a circuit diagram of a power module employing a field effect semiconductor device (IGBT) according to a second embodiment of the present invention.

FIG. 6 shows a power module employing an IGBT 2 acting as a field effect semiconductor device according to a second embodiment of the present invention. In FIG. 6, the gate resistance circuit 5 is constituted by the first gate resistance 6, a first series circuit connected to the first gate resistance 6 in parallel and including a first Zener diode 7 and the second gate resistance 8, and a second series circuit connected to the first gate resistance 6 and including a second Zener diode 11 and a third resistance 12. The first Zener diode 7 is inserted such that an anode of the first Zener diode 7 is directed towards the gate electrode 2b, while second Zener diode 11 is inserted such that a cathode K of the second Zener diode 11 is directed towards the gate electrode 2b. Since other configurations of the second embodiment are similar to those of the first embodiment shown in FIG. 1, the description is abbreviated for the sake of brevity.

When the control voltage Vd is turned on, charging between the insulated gate G and the emitter E of the IGBT 2 is initially performed by a parallel circuit including the first gate resistance circuit 6 and the third gate resistance 12 and then, is performed by only the first gate resistance 6 when the gate voltage $V_{GE}$ has reached a predetermined value. Therefore, in a first half stage of charging, in which quantity of generated noises is small even if the value of (dv/dt) is large, turn-on time is shortened and thus, thermal loss due to the emitter current $I_E$ can be restrained. Meanwhile, in a last half stage of charging, the value of (dv/dt) is lowered, so that noises can be restrained and thus, the highly efficient low-noise IGBT 2 can be obtained.

On the other hand, when the control voltage Vd is turned off, electric charge stored between the insulated gate G and the emitter E of the IGBT 2 is discharged via a parallel circuit including the first gate resistance 6 and the second gate resistance 8 in the same manner as the first embodiment.

Meanwhile, since the Zener diode 7 is inserted in series with the second gate resistance 8 in the first embodiment and the first and second Zener diodes 7 and 11 are inserted in series with the second and third gate resistances 8 and 12, respectively in the second embodiment, such an effect that the insulated gate portion of the IGBT 2 is protected from surge generated at the insulated gate portion can be gained. However, in the first and second embodiments, if a mechanism for protecting the insulated gate potion of the IGBT 2 from surge generated at the insulated gate portion is provided, the same effects as those of the first and second embodiments can be achieved even if an ordinary diode is employed in place of the Zener diode.

The following effects can be gained in the present invention.

In the first embodiment, since the gate resistance circuit is inserted between the gate electrode pad and the gate electrode so as to be formed integrally with the insulated gate electrode portion and the gate resistance circuit comprises the first gate resistance and the first series circuit connected to the first gate resistance in parallel and including the second gate resistance and the first diode such that the anode of the first diode is connected to the gate electrode, the substrate is made compact and production cost of the field effect semiconductor device is lowered. Meanwhile, since the rise rate of the gate voltage upon turning on of the control voltage is determined by the first gate resistance, the rise rate of the gate voltage is restrained and thus, noises are reduced. On the other hand, since the fall rate of the gate voltage upon turning off of the control voltage is determined by combined resistance of the first and second gate resistances connected to each other in parallel, the fall rate of the gate voltage is raised properly, so that thermal loss of the field effect semiconductor device is lessened and thus, thermal breakdown of the field effect semiconductor device is prevented. Furthermore, since the fall rate of the gate voltage can be increased in a first half stage of discharge and reduced in a last half stage of discharge at the time of turning off of the control voltage, noises and power dissipation at the time of turning off of the control voltage can be restrained and reliability of the field effect semiconductor device can be upgraded.

Meanwhile, in the second embodiment, since the gate resistance circuit further comprises the second series circuit connected to the first gate resistance in parallel and including the third gate resistance and the second diode such that the cathode of the second diode is connected to the gate electrode, the rise rate of the gate voltage can be increased in a first half stage of charging and reduced in a last half stage of charging also at the time of turning on of the control voltage in addition to the effects of the first embodiment, noises and power dissipation at the time of turning on of the control voltage can be restrained and reliability of the field effect semiconductor device can be upgraded.

In the first and second embodiments, since a diode acts as the first diode or each of the first and second diodes and the forward voltage generated in the diode by the charging and discharge currents is set to be not less than the threshold voltage of the field effect semiconductor device, the rise and fall rates of the gate voltage can be set to be large in a first half stage of charging and discharge and small in a last half stage of charging and discharge at the time of turning on and turning off of the control voltage, so that noises and power dissipation at the time of turning on and turning off of the control voltage can be restrained and reliability of the field effect semiconductor device can be upgraded.

Meanwhile, in the first and second embodiments, since the diode includes a plurality of diode elements connected to each other in series such that the setting of the forward voltage of the diode is effected, noises and power dissipation at the time of turning on and turning off of the control voltage can be restrained and reliability of the field effect semiconductor device can be upgraded.

If an area of the diode is set such that the setting of the forward voltage of the diode is effected, noises and power dissipation at the time of turning on and turning off of the control voltage can be restrained and reliability of the field effect semiconductor device can be upgraded.

In the first and second embodiments, since a diode acting as the first diode or each of the first and second diodes is a Zener diode, the gate electrode can be protected from surge voltage produced at the time of switching. Moreover, since the Zener diode can be integrally built in the field effect semiconductor device easily, it is possible to obtain the inexpensive and highly reliable field effect semiconductor device having excellent resistance to surge voltage.

Meanwhile, in the production method of the field effect semiconductor device, the highly reliable field effect semiconductor device can be easily produced at low cost.

What is claimed is:

1. In a field effect semiconductor device in which switching is performed by a gate voltage inputted from outside via a gate resistance circuit for restricting charging and discharge currents flowing between an insulated gate and an emitter, the improvement comprising:
   an insulated gate electrode portion which is formed by a gate electrode pad and a gate electrode insulated from the gate electrode pad;
   the gate resistance circuit being inserted between the gate electrode pad and the gate electrode so as to be formed integrally with the insulated gate electrode portion; and
   the gate resistance circuit comprising a first gate resistance and a first series circuit connected to the first gate resistance in parallel and including a second gate resistance and a first diode such that an anode of the first diode is connected to the gate electrode.

2. A field effect semiconductor device according to claim 1, wherein the gate resistance circuit further comprises a second series circuit connected to the first gate resistance in parallel and including a third gate resistance and a second diode such that a cathode of the second diode is connected to the gate electrode.

3. A field effect semiconductor device according to claim 1, wherein a forward voltage generated in the first diode by the charging and discharge currents is set to be not less than a threshold voltage of the field effect semiconductor device.

4. A field effect semiconductor device according to claim 2, wherein a forward voltage generated in each of the first and second diodes by the charging and discharge currents is set to be not less than a threshold voltage of the field effect semiconductor device.

5. A field effect semiconductor device according to claim 3, wherein the first diode includes a plurality of diode elements connected to each other in series such that said setting of the forward voltage of the first diode is effected.

6. A field effect semiconductor device according to claim 4, wherein each of the first and second diodes includes a plurality of diode elements connected to each other in series such that said setting of the forward voltage of each of the first and second diodes is effected.

7. A field effect semiconductor device according to claim 3, wherein an area of the first diode is set such that said setting of the forward voltage of the first diode is effected.

8. A field effect semiconductor device according to claim 4, wherein an area of each of the first and second diodes is set such that said setting of the forward voltage of each of the first and second diodes is effected.

9. A field effect semiconductor device according to claim 1, wherein the first diode is a Zener diode.

10. A field effect semiconductor device according to claim 2, wherein each of the first and second diodes is a Zener diode.

11. A method of producing a field effect semiconductor device, comprising:
   a first step in which a P type diffused layer and a gate oxide film are formed on an N− layer of a silicon wafer, a polysilicon layer is formed on the gate oxide film and a P base layer is formed by removing a predetermined area of the polysilicon layer;
   a second step in which a portion of the polysilicon layer and a portion of the gate oxide film are exposed and are subjected to introduction of boron and thermal diffusion such that not only a P type polysilicon layer is formed in the exposed portion of the polysilicon layer but a P+ layer is formed on the P base layer;

a third step in which the P type polysilicon layer and the P+ layer are exposed except for a portion of the P type polysilicon layer and a portion of the P+ layer and are subjected to introduction of arsenic and thermal diffusion such that not only an N emitter layer is formed in the exposed P+ layer but an N type polysilicon gate and an N type polysilicon layer are formed in the exposed P type polysilicon layer, a resistance portion is formed in the N type polysilicon layer and a diode portion including a plurality of diode elements connected to each other in series is formed in an area having the N type polysilicon layer and unexposed portion of the P type polysilicon layer arranged alternately;

a fourth step in which an interlayer dielectric layer for covering the N type polysilicon gate, the N type polysilicon layer and the P type polysilicon layer is formed; and a fifth step in which a portion of the interlayer dielectric layer is removed, an aluminum electrode layer is formed on the removed portion and the remaining portion of the interlayer dielectric layer and a portion of the aluminum electrode layer is removed so as to form an emitter electrode, a gate electrode and a gate electrode pad such that a gate resistance circuit formed by the resistance portion and the diode portion is inserted between the gate electrode and the gate electrode pad.

* * * * *